United States Patent [19]

Feldstein

[11] 4,048,354
[45] Sept. 13, 1977

[54] METHOD OF PREPARATION AND USE OF NOVEL ELECTROLESS PLATING CATALYSTS

[76] Inventor: Nathan Feldstein, P.O. Box 2027, Princeton, N.J. 08540

[21] Appl. No.: 625,326

[22] Filed: Oct. 23, 1975

[51] Int. Cl.$^2$ .............................................. C23C 3/02
[52] U.S. Cl. ................... 427/304; 427/306; 106/286; 106/287 R; 252/313 R
[58] Field of Search ............... 427/304, 305, 306, 98; 106/286, 287 R, 20; 252/313 R, 411 R, 472; 204/181

[56] References Cited

U.S. PATENT DOCUMENTS

| | | | |
|---|---|---|---|
| 3,011,920 | 12/1961 | Shipley | 427/304 X |
| 3,206,408 | 9/1965 | Vitalis et al. | 252/140 X |
| 3,532,518 | 10/1970 | D'Ottavio | 427/304 X |
| 3,790,400 | 2/1974 | Kuzmik | 427/306 X |
| 3,854,952 | 12/1974 | Kenney | 252/313 R X |
| 3,904,792 | 9/1975 | Gulla et al. | 427/304 X |
| 3,958,048 | 5/1976 | Donovan et al. | 427/306 X |

*Primary Examiner*—Ralph S. Kendall
*Attorney, Agent, or Firm*—Joel F. Spivak

[57] ABSTRACT

A method for the formation of novel colloidal catalytic electroless plating compositions comprises admixing a highly stable non-active colloidal dispersion with an activity modifier. The mixture so formed is used in electroless plating processes wherein a pre-cleaned substrate is contacted with the novel colloidal catalytic composition, rinsed, contacted with a reducing or activating solution and then contacted with an electroless plating solution.

34 Claims, No Drawings

METHOD OF PREPARATION AND USE OF NOVEL ELECTROLESS PLATING CATALYSTS

BACKGROUND OF THE INVENTION

In the plating of dielectric substrates by chemical (electroless) plating it is well known that suitable catalytic treatment is a prerequisite for effective electroless metal deposition. Such practices are well known and accepted in the art.

In examining the prior art for catalytic treatment it appears that while different procedures have been used, the incorporation of precious metals (e.g. palladium containing solutions) was common to all procedures. One catalytic system of particular interest is the two step process as disclosed in U.S. Pat. No. 3,011,920. In the process disclosed, a colloidal solution composed of tin(II) and precious metal salts, generally with hydrochloric acid, is used. The effective catalyst is proposed to be a colloid of an elemental precious metal (e.g. palladium) stabilized by the excess stannous chloride present in the media. While the system disclosed in U.S. Pat. No. 3,011,920 has been quite popular in commercial practices, rising costs of precious metals and miscellaneous product reliability problems has led to the quest for new systems in which the use of precious metals, tin, as well as of the hydrochloric acid would be completely eliminated.

In meeting this objective it was found, as described in U.S. Ser. No. 512,224, filed by the applicant herein, that colloidal systems based upon non-precious metals could constitute the basis for new commercial plating processes. More specifically, it was found that colloidal hydrous-oxides of non-precious metals (preferably selected from the group of copper, cobalt and nickel) may be used in the direct replacement of the tin/palladium colloid followed by a treatment in a suitable reducing media. In the reducing media, reduction of the ionic portion of adduct derived through the adsorption from the colloidal media takes place, resulting in nucleating sites capable of initiation of the electroless process.

In reviewing the teaching disclosed in U.S. Ser. No. 512,224, it is recognized that many of the inherent disadvantages associated with the palladium based catalysts are eliminated. It is further recognized that based upon practices in this art that it is further essential that any catalytic system should maintain its properties especially with storage (e.g. several months) and shipment under conditions of substantial temperature fluctuations. It is thus highly desirable to have a media in which good colloidal stability would be maintained, and which at the same time has sufficient catalytic activity to be used in the plating process. I have observed that as one increases stability, activity is decreased thereby making it difficult to meet both requirements in a single system.

For example, I have observed that successful synthesis of active plating colloids has generally shown a limited stability (for long term storage purposes) due to coagulation which takes place leading to precipitation, with, of course, change in particle size and distribution during the coagulation process. In addition, I have noted that highly stabile colloidal dispersions have shown limited catalytic activity when used in accordance with Ser. No. 512,224 and moderate concentration of reducing media or activating media.

It is thus an object of this invention to provide a stable colloidal dispersion and at the same time providing a simple way by which the stable colloids may be transformed into an active catalytic form useful in electroless plating processes.

SUMMARY OF THE INVENTION

A method for preparing a novel catalytic colloidal composition useful in electroless plating techniques comprises the step of admixing a highly stable nonactive colloidal dispersion with an activity modifier. novel catalytic colloidal compositions prepared as above comprise stable colloidal hydrous oxides of non-precious or precious metals admixed with a reactivity modifier selected from the group consisting of surface active agents or soluble halides and combination thereof. The novel catalytic colloidal compositions are utilized in the electroless plating process which comprises the steps of treating a dielectric substrate with the active catalytic colloidal composition and then, when necessary, to further treat the substrate with a reducing or activating composition to provide additional active nuclei on the substrate surface, the activated substrate is then contacted with an electroless plating bath.

DETAILED DESCRIPTION OF THE INVENTION

The process of the present invention is applicable to the metallic plating of dielectric substrates by autocatalytic or as more commonly known, electroless plating. Such processss are well known in the art and they produce a wide variety of products varying from printed circuitry arrays, decorative plated plastics parts and magnetic tapes to metallized fibers.

The term "hydrous oxide" as used herein is intended to encompass the insoluble oxides and insoluble hydroxides of metals. The preferable hydrous oxides are selected from the group consisting of oxides and hydroxides of cobalt, nickel and copper and mixtures thereof. Other suitable hydrous oxides include oxides and hydroxides of precious metals such as palladium, silver and others.

It is also recognized that metallic colloids, (e.g. colloids of copper and nickel as well as alloys thereof) due to their pyrophoric nature when in contact with air and water, are really metallic nuclei with an outer oxidized surface and thus are also considered herein as hydrous oxide colloids. In addition, colloidal metallic nuclei of precious metals, while they are more inert towards oxidation, are also suitable in the practice of the present invention.

The methods of preparation of hydrous oxide colloids are well known in the prior art as exemplified by *Inorganic Colloid Chemistry* by H. B. Weiser, Vol. I and Vol. II, John Wiley & Sons, Inc., New York (1935) and U.S. Pat. No. 3,657,003.

The term "stabilizer" as used herein is intended to encompass substances which alter the characteristics of the colloid so as to prevent, delay or minimize their coagulation and precipitation. It is believed that these stabilizers are adsorbed onto the surface of the colloids thereby altering the surface charge and hence their stability. Stabilizers contemplated by the present process and solution may include secondary colloids (gelatin), surfactants, sugars and polyalcohol (glycerol).

The term "surfactant" (or surface active agent) as used herein generally refers to substances which are capable of lowering the surface tension of a liquid or the interfacial tension between two liquids. All useful surfactants possess the common feature of a water-soluble (hydrophillic) group attached to an organic (hydrophobic) chain. Surfactants as used herein are also intended to encompass detergents and emulsifying agents.

The term "reactivity modifier(s)" as used in the present invention generally refers to substances which while alone are generally inert in said plating process, their presence promotes activation of the otherwise stable colloids in the plating process. Such modifiers may be of organic or inorganic nature as well as combinations thereof.

It should be recognized by those skilled in the art that the preferred reactivity modifier composition to be added and the quantity thereof is best determined as a trail procedure for each stable colloid composition and/or substrate to be coated.

In general, the electroless plating process of the present invention comprises the steps of (1) priming a dielectric substrate by contacting the substrate (preferably one which was previously cleaned and etched to promote adhesion) with an activated colloidal catalytic solution, (2) rinsing the primed substrate and then (3) developing or activating the substrate further by contacting the substrate with a reducing agent (or activating agent) to form a discontinuous layer of the metal either in a reduced oxidation state or in a more activated state, thus forming the catalytic nuclei active for the initiation of the electroless plating and (4) contacting the substrate with a compatible electroless plating formulation. In the above catalytic treatment, when employing colloidal dispersions comprising precious metals in their elemental state, sufficient activation of the substrate may be accomplished at the priming step without requiring the additional activation with a separate reducing or activating composition prior to contacting the substrate with the electroless plating bath.

The following examples are illustrative of the concept of the present invention and are not to be taken as in limitation thereof; moreover, it should be obvious to those skilled in the art that further optimization is possible with respect to compositions and conditions indicated as having less than 100% coverage.

EXAMPLE 1

This example shows the general procedure of the novel electroless plating process. Acrylo-nitryl-butadienestyrene (ABS) substrates (Monsanto PG Grey-299) were etched in a solution comprising 400 g/l $CrO_3$ and 350 g/l $H_2SO_4$ (conc.) for about 5 minutes at 70° C. Thereafter, the etched substrates were immersed in a colloidal catalytic primer solution for about 5 minutes with said solution at 40° C. The primed substrates were then rinsed and immersed in a developer solution comprising 0.5 g/l $NaBH_4$ for a few minutes. The substrates were rinsed and then immersed in an electroless copper bath operating at 40° C and having the following composition.

$CuSO_4.5H_2O$ — 15 g/l
EDTA (40%) — 68 cc/l
NaOH — 9 g/l
NaCN — 3 ppm
Tergitol TMN — 0.2 (% wt.)
$H_2CO$ (37%) — 22 cc/l Final colloidal catalytic primer dispersions (working media) were made by the dilution of premade concentrated stock; the latter was generally prepared via thermal aging (about 18 hours) at 75° C or other equivalent conditions. While in these examples substrates were pre-cleaned and etched using a wet chemical technique, other techniques of performing the preferred etching which are of a dry nature may be substituted and used in accordance to the present invention.

| No. | Final composition of Colloidal Catalytic Primer | Relative (%) Plating Coverage |
|-----|--------------------------------------------------|-------------------------------|
| 1a  | $PdCl_2$ 0.94 g/l<br>Geltine 1.5 g/l<br>pH final approx. 7.7 | 30 |
| 1b  | Same as 1a with 50 g/l NaCl (reactivity modifier) | 48 |
| 1c  | Same as 1a with 0.05 M sodium laurylsulfate (reactivity modifier) | 37 |

EXAMPLE 2

Solutions, substrates and procedures were same as in Example 1, except for the substitution of colloidal catalytic primer solution which is not based upon palladium hydrous oxide. A stabilized colloid (291m) was prepared by the admixing of 12.2 g/l $Cu(NO_3)_2.3H_2O$, 12.2 gr/l gelatine and sodium hydroxide in an amount representing twice the molar concentration of the copper ion. Prior to aging pH was adjusted to 9.0 and thereafter aging for about 16 hours was undertaken at 75° C.

| No. | Final Composition of Colloidal Catalytic Primer | Relative (%) Plating Coverage |
|-----|-------------------------------------------------|-------------------------------|
| 2a  | 4:1 dilution of stock primer soln. with water | 0 |
| 2b  | Same as above with 0.025M sodiumlaurylsulfate | 100 |
| 2c  | Same as 2a with 0.025M sodiumdecylsulfate | 95 (average) |

Using the same final composition of catalytic primer as in 2a and 2b but including 0.27 g/l of $NaBH_4$ gave a plating coverage of 0% and 75% for media 2a and 2b respectively. It should thus be recognized in the optimization of the process and solutions, plating coverage is dependent upon the reducing media reactivity (e.g. concentration), nature and amount of added reactivity modifier, as well as the amount and nature of colloid stabilizer used in the preparation of the stabilized colloid as well as nature and reactivity of the electroless plating formulation.

EXAMPLE 3

It was also found that the present invention may be implemented in an alternative seqence of steps. For example, solutions and substrates were all the same as in Example 1 while the following key steps were undertaken.

1. Immersion in the colloidal catalytic media cited in Example 2, No. 2a followed by a water rinse; then
2. Immersion for 5 minutes in a surfactant solution composed of 0.025M sodium laurylsulfate at 40° C and rinse; then
3. Immersion for 5 minutes in 0.5 g/l $NaBH_4$ and rinse; finally
4. Immersion in the electroless copper formulation.

Results showed 90% metallic coverage. While the process shown in this example requires more steps in comparison to the proces shown in Example 2, its adaptation falls within the spirit of this invention. Using the above surfactant prior to the immersion into the stabilized colloidal solution did not produce any perceptible plating results.

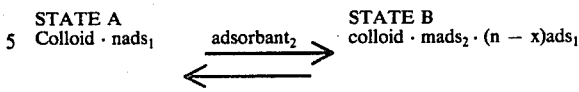

EXAMPLE 4

Solutions, substrates and procedure were the same as in Example 1, except for the substitution of the following colloidal catalytic primer.

| No. | Final Working Composition of Colloidal Catalytic Primer | Relative (%) Plating Coverage |
|---|---|---|
| 3a | 3.15 g/l protective colloid*<br>0.005 M $Cu^{+2}$<br>pH final approx. 9.0 | 0 |
| 3b | Same as above with 0.025M Sodium dodecylsulfate (reactivity modifier) | 90 |

*The protective colloid used is an extracted and refined collagen protein and is designated as Fluid Colloid EZ-3 sold by the Swift Chemical Company. The concentrate stock dispersion was prepared under standard laboratory condition.

EXAMPLE 5

Catalytic solution were prepared by the admixing of cobalt sulfate, water, a material(s) selected from lingosulfonates (derivative of lingnin) and sodium hydroxide. In a typical case (41-4) the catalytic solution was comprised of $CoSO_4 \cdot 7H_2O$ — 14.3 g/l
Lignosulfonate — 12.5 g/l
pH (after hydroxide addition and aging) — about 7.9

Dilution of above with water (1:9) and utilization in the present process steps (as defined in Example 1) gave good metallic coverage. Similarly, nickel and copper catalytic solution are prepared using any of several soluble salts and hydroxides.

It is interesting to note that using, for example, the sodium dodecylsulfate prior to the immersion into the stabilized colloidal media did not provide improved results in comparison to the inclusion of such reactivity modifier along with the stabilized colloid.

It is further interesting to note that attempts to prepare concentrated colloidal solution comprising both stabilizers and the reactivity modifier(s) do not exhibit as good stability relative to dispersions comprising stabilizer(s) alone.

While we do not wish to be bound by theory, the following model is proposed for possible account of the phenomenon at hand. In the formation of highly stabilized colloidal dispersions, the colloidal nuclei (e.g. hydrous oxide of copper) are surrounded by a stabilizer(s) which is adsorbed onto said nuclei. It is probably the degree of adsorption and its consequent charge modifications which contributes to the stabilization mechanism and at the same time makes the colloidal nuclei sterically impervious to the chemical reaction with subsequent reducing agent, especially when the latter are used in moderate reactivity (e.g., concentration of said reducing agent) required for economical plating processes.

Upon the transformation of the highly stabilized colloids, some removal of stabilizer(s) from the adsorbed layer takes place by a displacement reaction making the colloid nuclei more accessible to subsequent interaction with the reducing media and hence increasing its reactivity in the plating process.

It should be understood that although the term colloid stabilizer refers to various compounds, the effectiveness of stabilizers is not necessary the same; and thus a stabilizer in one system may be a reactivity modifier in another system.

Schematically, the following simple equilibria reaction may represent the present findings STATE A          STATE B
Colloid $\cdot$ $nads_1$ $\underset{\longleftarrow}{\overset{adsorbant_2}{\longrightarrow}}$ colloid $\cdot$ $mads_2 \cdot (n-x)ads_1$ in which ads denotes adsorbant; $n$, $m$, $x$ denotes some value. Also $ads_1$ and $ads_2$ are chemically distinguishable. In State A a highly stable colloidal dispersion relative to State B is present; however, it is of less reactive nature in the electroless catalytic process. As aforesaid, the present invention is not bound to the proposed model and furthermore, in any of the states shown there may be more than one adsorbant as well as a multiplicity of colloids, having different metallic nature and/or morphology.

It should be recognized that the present invention is not limited to the nature or specific reducing agent used in the process of plating. Moreover, this invention is also not limited to the use of a reducing agent in the developing or activating step of the procedure. It should also be obvious to those skilled in the art that compatible electroless formulations should be selected.

It has also been recognized that in using the process according to U.S. Ser. No. 512,224 or that of U.S. Pat. Nos. 3,772,056 and 3,772,078, some contamination of the reducing media would take place with time. The nature of the contamination may be either ionic or colloidal as well as combination thereof. It is further recognized that such contamination would tend to interact with the reducing media accounting for some undesired homogenous decomposition.

It is therefore highly desireable to insure that such homogenous decomposition catalyzed by metallic impurities be minimized. In meeting this objective it is proposed that selective additives in controlled concentrations be incorporated in the reducing media. Specifically, chelating (or complexing) agents should be incorporated for the complexion of metallic ions while strong colloidal stabilizers should be incorporated in the encapsulation of colloidal particles. It may further be necessary to add a combination of both types of materials. In introducing such materials (stabilizers) caution ought to be exercised in insuring that the reduction process is unperturbed; thus, the concentration of said stabilizers should be controlled.

What I claim is:

1. A method for forming an active catalyst useful in electroless plating processes comprising a metal capable of electroless plating initiation derived from the admixing of weakly active colloidal dispersion of said metal or a compound of said metal or alloy of said metal containing a stabilizer so as to render said dispersion stable with a reactivity modifier selected from the groups consisting of surfactants and soluble halides.

2. The method recited in claim 1 wherein said colloidal dispersion comprises dispersions of hydrous oxides.

3. The method recited in claim 2 wherein said hydrous oxides are selected from the group consisting of hydrous oxides of cobalt, nickel, copper, palladium and silver.

4. The method recited in claim 1 wherein said reactivity modifier is selected from the group consisting of sodiumlaurylsulfate and sodiumdecylsulfate.

5. The method recited in claim 1 wherein said hydrous oxide is selected from at least one member of the group consisting of hydrous oxides of cobalt nickel, copper, palladium and silver.

6. The method recited in claim 5 wherein said reactivity modifier is selected from at least one member of the group consisting of sodiumlaurylsulfate and sodiumdecylsulfate.

7. The method according to claim 1 wherein said weakly active colloidal dispersion comprises non-precious metal.

8. The method according to claim 7 wherein non-precious metals are selected from at least one member of the group consisting of copper, cobalt, nickel, and iron.

9. The method according to claim 1 wherein said weakly active colloidal dispersion comprises precious metal devoid of tin.

10. The method according to claim 1 wherein the colloid of the weakly active colloidal dispersion is negatively charged.

11. The method according to claim 1 wherein the colloid of the weakly active colloidal dispersion is positively charged.

12. An active catalyst suitable for use in the preparation of non-conductors prior to electroless plating processes comprising a metal capable of electroless plating initiation resulting from the admixture of a weakly active colloidal dispersion of said metal or a compound of said metal or alloy of said metal containing a stabilizer therein with a reactivity modifier selected from the group consisting of surfactants and soluble halides.

13. The catalyst according to claim 12 wherein said weakly active colloidal dispersion comprises of non-precious metals.

14. The catalyst according to claim 13 wherein the non-precious metals are selected from at least one member of the group consisting of copper, cobalt, nickel and iron.

15. The active catalyst according to claim 12 wherein the colloid of the colloidal dispersion is negatively charged.

16. A catalyst suitable for use in electroless plating processes comprising a catalytic metal capable of electroless plating initiaion resulting from the admixture of a weakly active colloidal dispersion of an hydrous metal oxide of said metal a stabilizer and a reactivity modifier selected from at least one member of the group consisting of surface active agent and a soluble halide.

17. The catalyst recited in claim 16 wherein said hydrous oxide is selected from at least one member of the group consisting of hydrous oxides of cobalt, nickel, copper, palladium and silver.

18. The catalyst recited in claim 16 wherein said surface active agent is selected from the group consisting of sodiumlaurylsulfate and sodiumdecylsulfate.

19. A process for electroless plating a non-metallic substrates comprises of the steps of:
   a. cleaning said substrate,
   b. immersing said substrate in a colloidal catalytic primer composition comprising a catalytic metal capable of electroless plating initiation prepared by admixing a weakly active colloidal dispersion of said metal or a compound of said metal or alloy of said metal containing a stabilizer therein with a reactivity modifier selected from the group consisting or surfactants and soluble halides and
   c. immersing the substrate in an electroless plating bath.

20. The process recited in claim 19 including the step of immersing the primed-substrate in a developer solution prior to immersion in said electroless plating bath, 21. The process according to claim 19 wherein said weakly active colloidal dispersion comprises non-precious metal.

22. The process according to claim 21 wherein the non-precious metal is selected from at least one metal of the group consisting of copper, cobalt, nickel, and iron.

23. The process according to claim 19 wherein the weakly active colloidal dispersion comprises of precious metals.

24. The process according to claim 23 wherein said weakly active colloidal dispersion is further admixed with a surfactant, 25. The process according to claim 19 wherein the colloid of the colloidal catalytic primer composition is negatively charged. Please amend the following claims:

26. An active catalytic formulation useful in electroless plating processes comprising the product of the admixture of a soluble metal salt, a lignosulfonate and an alkaline compound, wherein the metal of said metal salt is capable of electroless plating initiations.

27. A method for forming an active catalytic composition useful in electroless plating processes comprising the admixing a stable, weakly active colloidal dispersion with a reactivity modifier wherein said stable dispersion is prepared by the admixing and aging of a soluble metal salt of a catalytic metal, protein and an alkaline compound capable of electroless plating initiation and wherein said reactivity modifier is a surfactant.

28. The method according to claim 27 wherein the reactivity modifier is an alkali alkylsulfate selected from the group consisting of alkalilaurylsulfate and alkailidecylsulfate.

29. The method according to claim 27 wherein the protein is gelatin.

30. The method according to claim 27 wherein the soluble metal salt is selected from at least one metal of the group consisting of copper, cobalt, nickel, and iron.

31. The method according to claim 27 wherein the colloid of said dispersion is positively charged.

32. The method according to claim 27 wherein the colloid of said dispersion is negatively charged.

33. The method according to claim 27 wherein said reactivity modifier in a soluble halide.

34. A process for the preparation of non-metallic substrates prior to electroless plating comprises the steps of
   a. Immersing said substrate in a weakly active colloidal catalytic composition containing a stabilizer, and
   b. Immersing the substrate in a composition comprising a reactivity modifier wherein said reactivity modifier is a surfactant devoid of any reducing agent.

* * * * *